(12) United States Patent
Lage

(10) Patent No.: US 10,789,409 B2
(45) Date of Patent: Sep. 29, 2020

(54) PARASITIC EXTRACTION USING TOPOLOGICAL SHAPE DESCRIPTORS

(71) Applicant: Mentor Graphics Corporation, Wilsonville, OR (US)

(72) Inventor: Christian Lage, Berlin (DE)

(73) Assignee: Mentor Graphics Corporation, Wilsonville, OR (US)

(*) Notice: Subject to any disclaimer, the term of this patent is extended or adjusted under 35 U.S.C. 154(b) by 123 days.

(21) Appl. No.: 15/971,216

(22) Filed: May 4, 2018

(65) Prior Publication Data

US 2019/0303528 A1 Oct. 3, 2019

Related U.S. Application Data

(60) Provisional application No. 62/650,526, filed on Mar. 30, 2018.

(51) Int. Cl.
*G06F 17/50* (2006.01)
*G06F 30/398* (2020.01)
*G06F 30/23* (2020.01)

(52) U.S. Cl.
CPC ............ *G06F 30/398* (2020.01); *G06F 30/23* (2020.01)

(58) Field of Classification Search
USPC ............ 716/50, 51, 52, 53, 54, 55, 122, 123
See application file for complete search history.

(56) References Cited

U.S. PATENT DOCUMENTS

| 8,516,404 | B1* | 8/2013 | Cao | G03F 1/70 |
| | | | | 716/50 |
| 8,918,751 | B1* | 12/2014 | McCracken | G06F 30/392 |
| | | | | 716/123 |
| 2011/0115024 | A1* | 5/2011 | Lee | H01L 21/823431 |
| | | | | 257/368 |
| 2016/0378888 | A1* | 12/2016 | Chidambarrao | G06F 30/367 |
| | | | | 716/135 |

OTHER PUBLICATIONS

"Computational Geometry: Lecture 7: Voronoi diagrams" *Voronoi diagrams*, 108 pages, accessed Apr. 4, 2018 at https://www.cise.ufl.edu/~sitharam/COURSES/CG/kreveldmorevoronoi.pdf.
Fortune, "A Sweepline Algorithm for Voronoi Diagrams," *Algorithmica*, vol. 2, pp. 153-174 (1987).
Wang et al., "Accurate Parasitic Resistance Extraction for Interconnection Analysis," *IEEE 1995 Custom Integrated Circuits Conferances*, pp. 255-258 (1995).

* cited by examiner

*Primary Examiner* — Brian Ngo

(57) ABSTRACT

System and methods for parasitic extraction of a layer of an integrated circuit are disclosed. In one example, geometric data for a conducting layer of an integrated circuit can be decomposed into homogeneous portions and nonhomogeneous portions. A shape analysis algorithm can be used to generate a shape descriptor including nodes within the nonhomogeneous portions. Parasitic values can be assigned to segments connecting the nodes of the shape descriptor. A circuit representation of the conducting layer can be generated based on the shape descriptor and the assigned parasitic values.

20 Claims, 11 Drawing Sheets

PARASITIC EXTRACTION USING TOPOLOGICAL SHAPE DESCRIPTORS

CROSS-REFERENCE TO RELATED APPLICATIONS

This application claims the benefit of U.S. Provisional Application No. 62/650,526, entitled "PARASITIC EXTRACTION USING TOPOLOGICAL SHAPE DESCRIPTORS," filed Mar. 30, 2018, the entire disclosure of which is incorporated herein by reference in its entirety.

BACKGROUND

Advances in computer architectures and in integrated circuit technology have enabled more transistors and associated components to be packed within an integrated circuit. The transistors and associated components (e.g., wires) of the integrated circuit can be represented by various data structures, such as geometric layer data, netlists, and so forth. The data structures can be used within an electronic design tool flow to simulate, test, and manufacture the integrated circuit. As the number of transistors and wires increases, so does a size of the data structures used to represent the transistors and wires. The size of the data structures can limit the electronic design tool flows by either setting a maximum size design that can be processed and/or by increasing the processing time of the electronic design tool flow for a given design. Thus, it can be desirable to reduce a size of the data structures used to represent a given integrated circuit to potentially increase a size of an electronic design that can be processed by the tool flow and/or to decrease the processing time of the electronic design tool flow for the given electronic design.

DETAILED DESCRIPTION

Introduction

Figure 1:
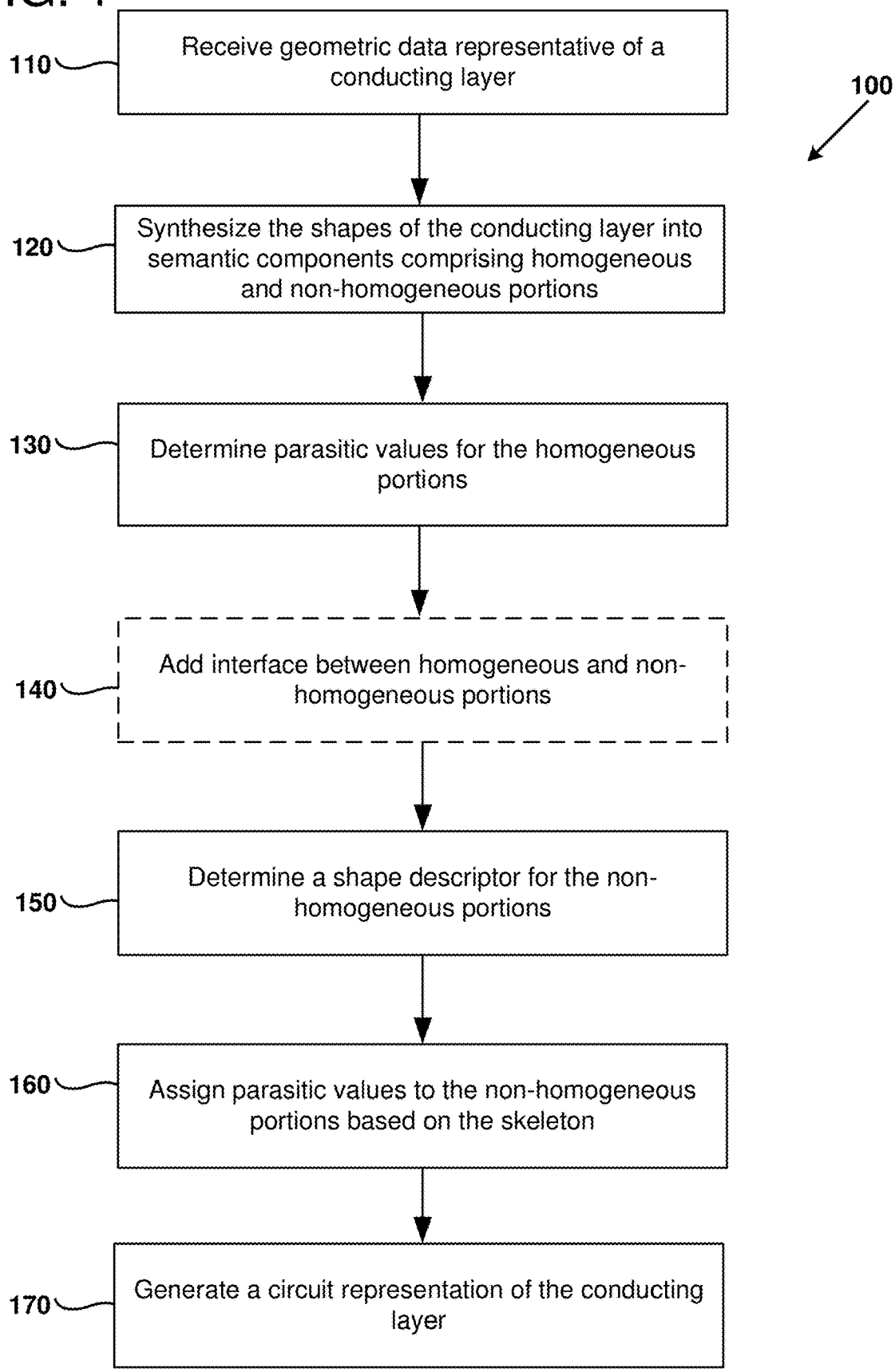
FIG. 1 is a flow diagram of an example method of extracting parasitic values for a conducting layer, such as a conducting layer of an integrated circuit.

Apparatus and methods are disclosed herein for performing parasitic extraction for a conducting layer, such as for an integrated circuit. In some examples of the disclosed technology, data comprising geometric data for a conducting layer of an integrated circuit can be received. The geometric data can be decomposed into homogeneous portions and nonhomogeneous portions. A shape analysis algorithm (e.g., a beachline algorithm) can be used to generate a shape descriptor (e.g., a skeleton) comprising nodes within the nonhomogeneous portions. Parasitic (e.g., resistance or capacitance) values can be assigned to nodes and/or segments connecting the nodes of the shape descriptor. A circuit representation (e.g., a netlist) of the conducting layer can be generated based on the shape descriptor and the assigned parasitic values.

One solution for extracting resistance from a conducting layer is to perform a finite element analysis (FEA) (also referred to as a finite element method (FEM)) of the conducting layer. Performing FEM can include subdividing the conducting layer into small portions (i.e., finite elements). The finite elements are used to discretize a differential equation (e.g., Laplace's equation) locally within the respective finite elements. The simple equations that model the finite elements can be assembled into a larger system of equations that models the entire conducting layer or by introducing appropriate boundary conditions a part of the conducting layer. A solution to the system of equations can be used to approximate a solution of the differential equation on the conducting layer. FEM can accurately extract the resistance of the conducting layer, but it may use a relatively large amount of memory and take a relatively large amount of processing time.

The processing time for the resistance extraction can be decreased at the expense of accuracy of the extraction. For example, the conducting layer can be divided into trapezoids (larger than the finite elements) and the resistance can be modelled using geometric-driven tessellation of a net of trapezoids. Geometric-driven tessellation can potentially provide satisfactory results (e.g., within a given margin of error) for larger process geometries, where it can be assumed that the current flows uniformly in one dimension. However, as integrated circuit process geometries shrink and routing layers become more complicated, the assumption of predominantly one-dimensional current flow can fail, causing potential inaccuracies in the resistance model to exceed the margin of error. The shortcomings in the resistance model may be primarily due to the limited topological knowledge remaining in the constructed tessellation. The full topological knowledge, however, is required for an appropriate physics-driven decomposition. Inaccuracies in the resistance model can result in increased effort in terms of development work for the integrated circuit and/or unexpected flaws in the manufactured integrated circuit.

As disclosed herein, a method can employ a shape analysis algorithm as a foundation for parasitic extraction. The shape analysis algorithm performs a topological or statistical analysis of a geometry of a source object, as opposed to analyzing electrical or other material properties of the source object. The shape analysis algorithm produces a topological shape descriptor that is a compact description of the shape and includes enough information to reconstruct the source object. As one example, a shape analysis algorithm can be a beachline algorithm that produces a topological skeleton as its shape descriptor. The topological skeleton can include nodes representative of points within the geometry of the source object, and adjacent nodes can be interconnected by segments. As a specific example, the topological skeleton can be a medial axis of the source object.

A topological skeleton can be used as a foundation for parasitic extraction, such as resistance or capacitance extraction. Using a topological skeleton for resistance extraction can potentially provide greater accuracy than pure geometric-driven tessellation and potentially use less memory and processing time compared to FEM. Skeletons can potentially provide an efficient representation of nets enabling the direct extraction of a highly accurate resistance network (also referred to as an R-network) without the need to identify specific patterns like corners, T-structures and crosses and while potentially reducing runtime. The skeletons can be computed by an efficient beachline algorithm. Furthermore, the new representation of nets can support on-the-fly detection of plate-type structures or structures of complex current flow within the net, which might otherwise require FEM or boundary element modeling (BEM). In this case, geometrical data computed while constructing the skeletons can imply a suitable meshing of the plate-structure to be used by FEM or BEM. Post-processing operations, such as current density computations or electro-migration (EM) rule checking, can also be supported.

The disclosed skeleton representation can be combined with a strategy for decomposing nets at equipotential lines, e.g., the decomposition does not introduce sources of inaccuracy. Thus, a high-degree of parallelism can potentially be achieved without introducing errors during the assembly of the R-network. The parallelism can potentially enable increased multi-threading, which can decrease the processing time for the resistance extraction.

Capacitance and/or inductance extraction are further applications of the approach. For example, shape descriptors, such as skeletons, representing the outside of nets can be used to derive capacitors directly or to control the process of extraction. Deriving the parasitic capacitance can differ from the derivation of the parasitic resistance by inserting capacitors perpendicular to the medial axis rather than inserting resistors along the medial axis. The topological information provided by skeletons can lead to more efficient pattern matching capabilities used by table look-up methods or statistical methods like random walk methods for capacitance extraction. For example, the run-length of parallel wires, periodicity of cross-overs or Gauss surfaces can be derived easily. With respect to inductance extraction, classifying essentially parallel running wires can be used to determine the inductance, even if the wires are far apart. This classification can be derived from skeletons. It should be noted that skeletons can represent layouts in a general way and are not restricted to Manhattan-type geometries.

General Considerations

This disclosure is set forth in the context of representative embodiments that are not intended to be limiting in any way.

As used in this application the singular forms "a," "an," and "the" include the plural forms unless the context clearly dictates otherwise. Additionally, the term "includes" means "comprises." Further, the term "coupled" encompasses mechanical, electrical, magnetic, optical, as well as other practical ways of coupling or linking items together, and does not exclude the presence of intermediate elements between the coupled items. Furthermore, as used herein, the term "and/or" means any one item or combination of items in the phrase.

The systems, methods, and apparatus described herein should not be construed as being limiting in any way. Instead, this disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed things and methods require that any one or more specific advantages be present or problems be solved. Furthermore, any features or aspects of the disclosed embodiments can be used in various combinations and subcombinations with one another.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed things and methods can be used in conjunction with other things and methods. Additionally, the description sometimes uses terms like "produce," "generate," "display," "receive," "evaluate," and "perform" to describe the disclosed methods. These terms are high-level descriptions of the actual operations that are performed. The actual operations that correspond to these terms will vary depending on the particular implementation and are readily discernible by one of ordinary skill in the art.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods that function in the manner described by such theories of operation.

Some of the disclosed methods can be implemented as computer-executable instructions stored on one or more computer-readable media (e.g., non-transitory computer-readable storage media, such as one or more optical media discs, volatile memory components (such as DRAM or SRAM), or nonvolatile memory components (such as hard drives and solid state drives (SSDs))) and executed on a computer (e.g., any commercially available computer, including smart phones or other mobile devices that include computing hardware). Any of the computer-executable instructions for implementing the disclosed techniques, as well as any data created and used during implementation of the disclosed embodiments, can be stored on one or more computer-readable media (e.g., non-transitory computer-readable storage media). The computer-executable instructions can be part of, for example, a dedicated software application, or a software application that is accessed or downloaded via a web browser or other software application (such as a remote computing application). Such software can be executed, for example, on a single local computer (e.g., as computer-readable instructions executing on any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C, C++, Java, or any other suitable programming language. Likewise, the disclosed technology is not limited to any particular computer or type of hardware. Certain details of suitable computers and hardware are well-known and need not be set forth in detail in this disclosure.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

Example Methods of Parasitic Extraction Using Topological Shape Descriptors

Figure 2:
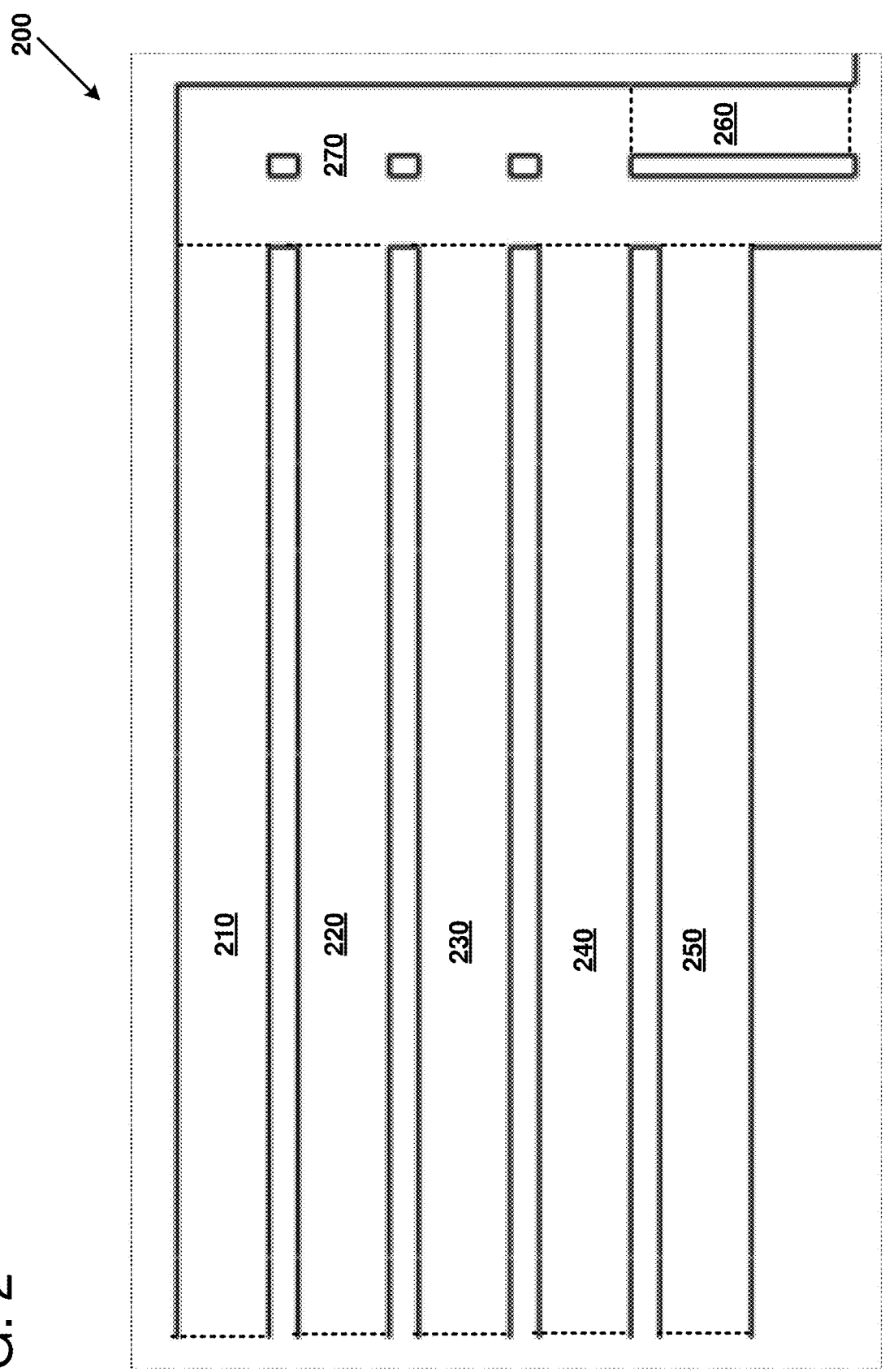
FIG. 2 illustrates an example layout for a conducting layer comprising homogeneous and nonhomogeneous portions.
Figure 3:
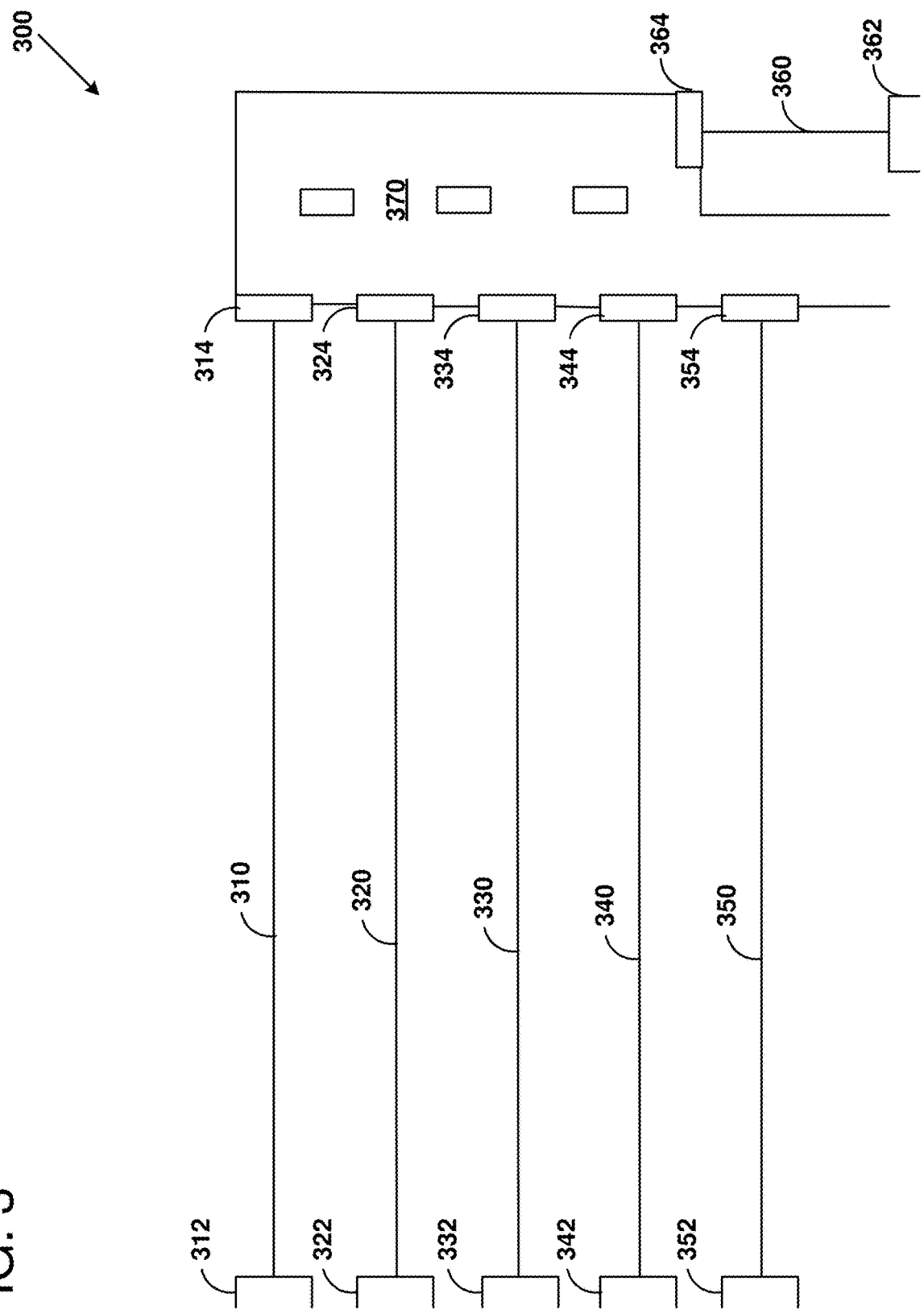
FIG. 3 illustrates an example of partitioning the conducting layer into different portions corresponding to the homogeneous and nonhomogeneous portions.
Figure 4:
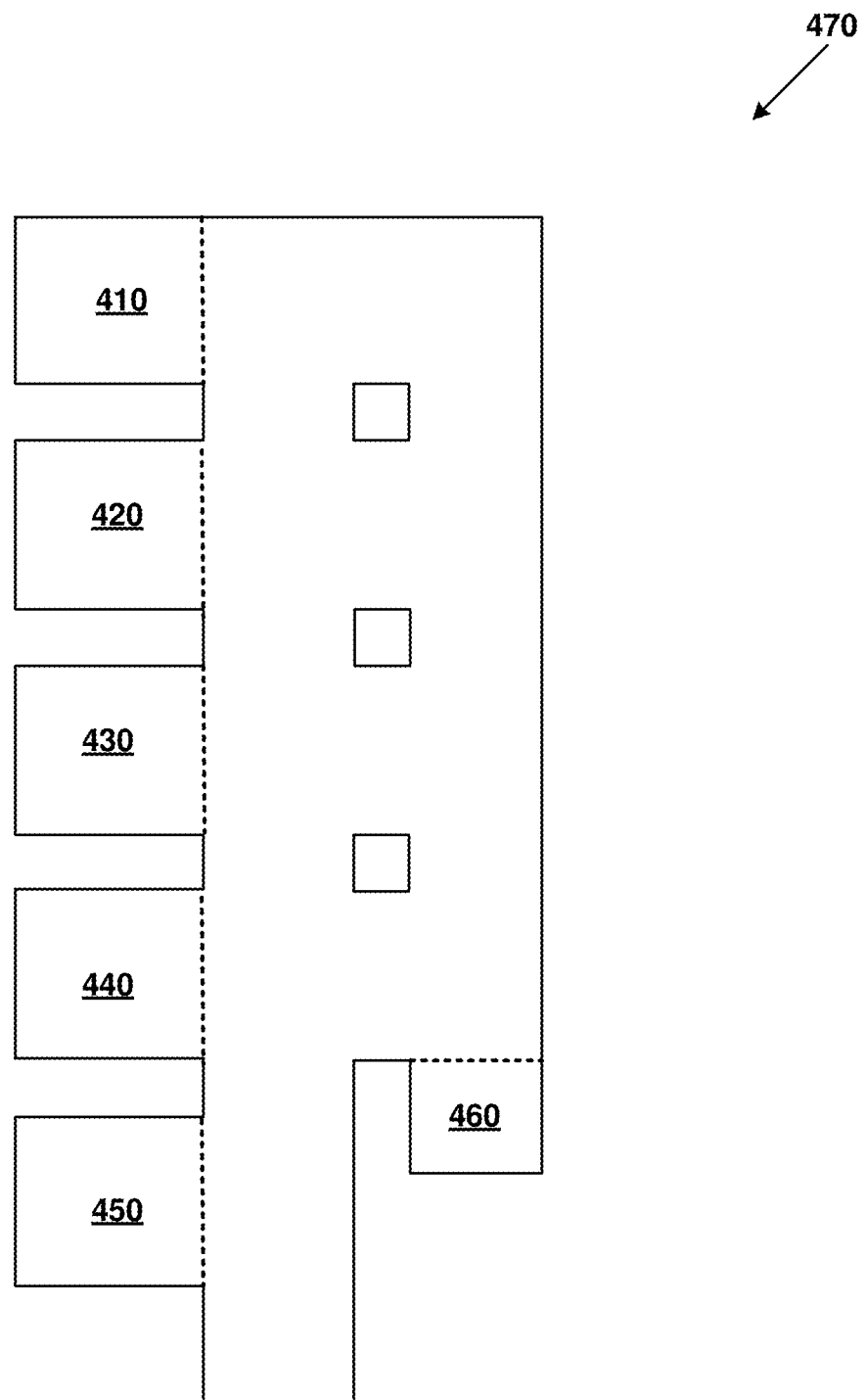
FIG. 4 illustrates an example of adding stubs to a nonhomogeneous portion as an interface to homogeneous portions.
Figure 5:
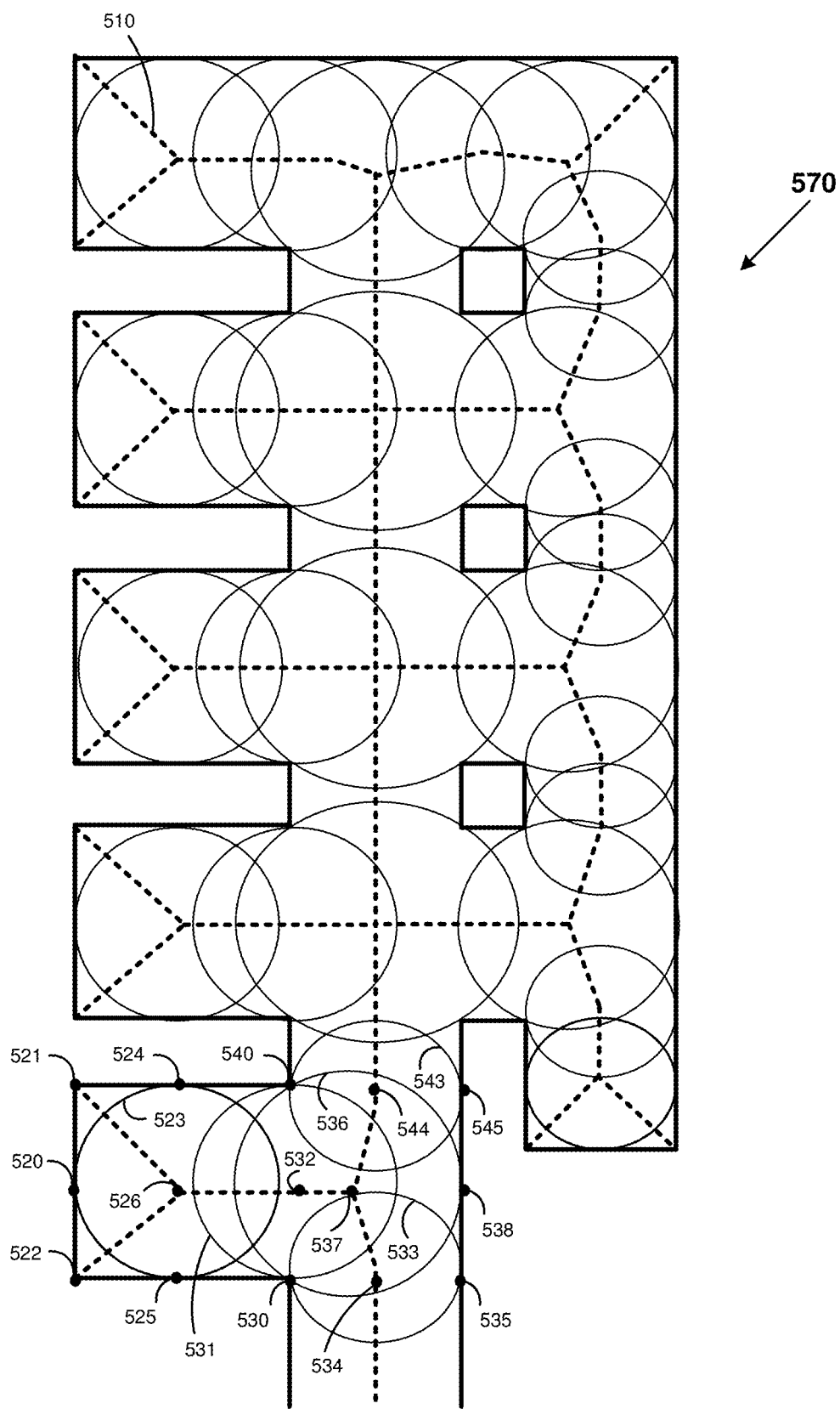
FIG. 5 illustrates an example of generating a skeleton for the nonhomogeneous portion using a beachline algorithm.
Figure 6:
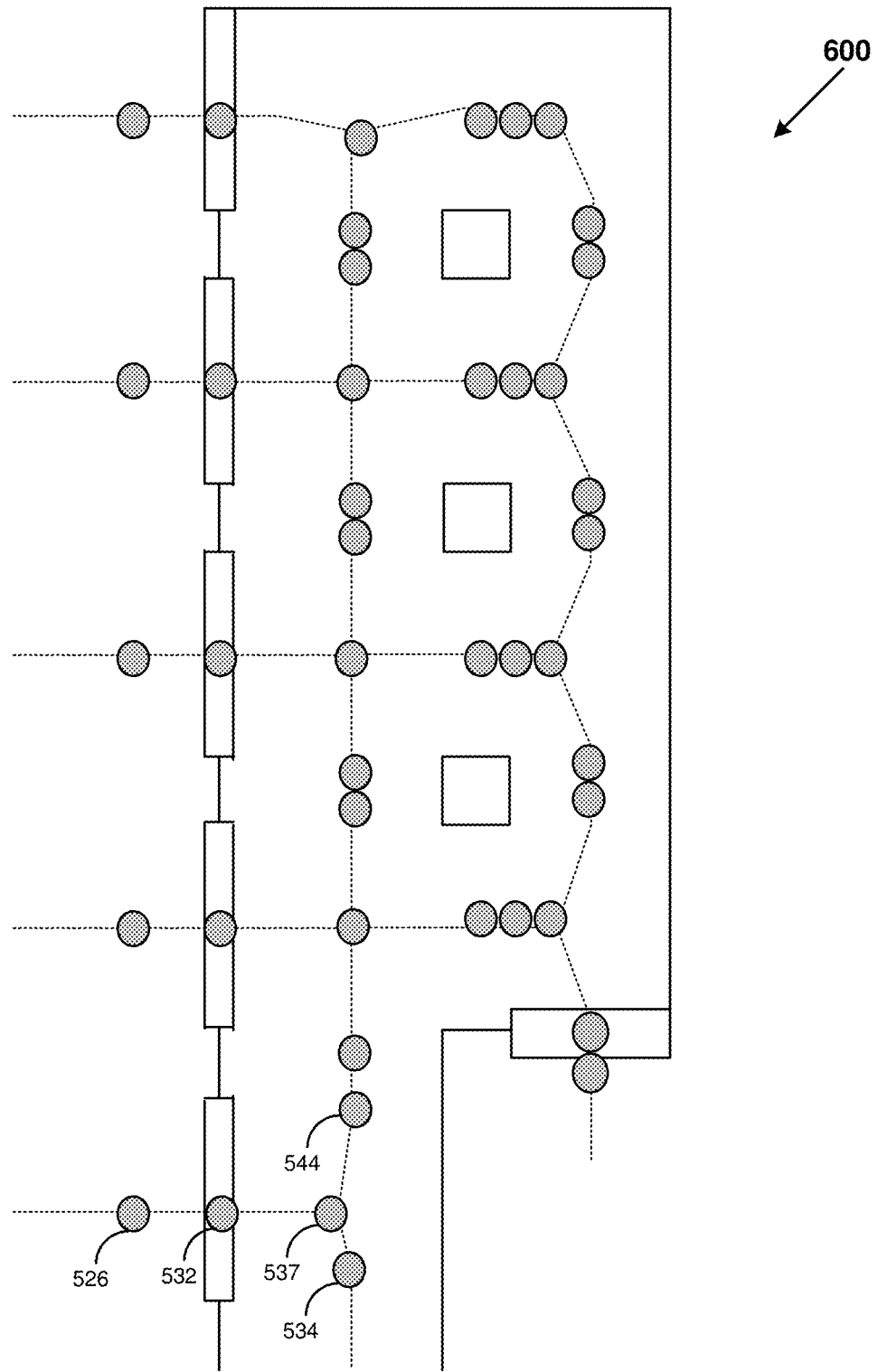
FIG. 6 illustrates an example of generating a resistor network for the nonhomogeneous portion.
Figure 7:
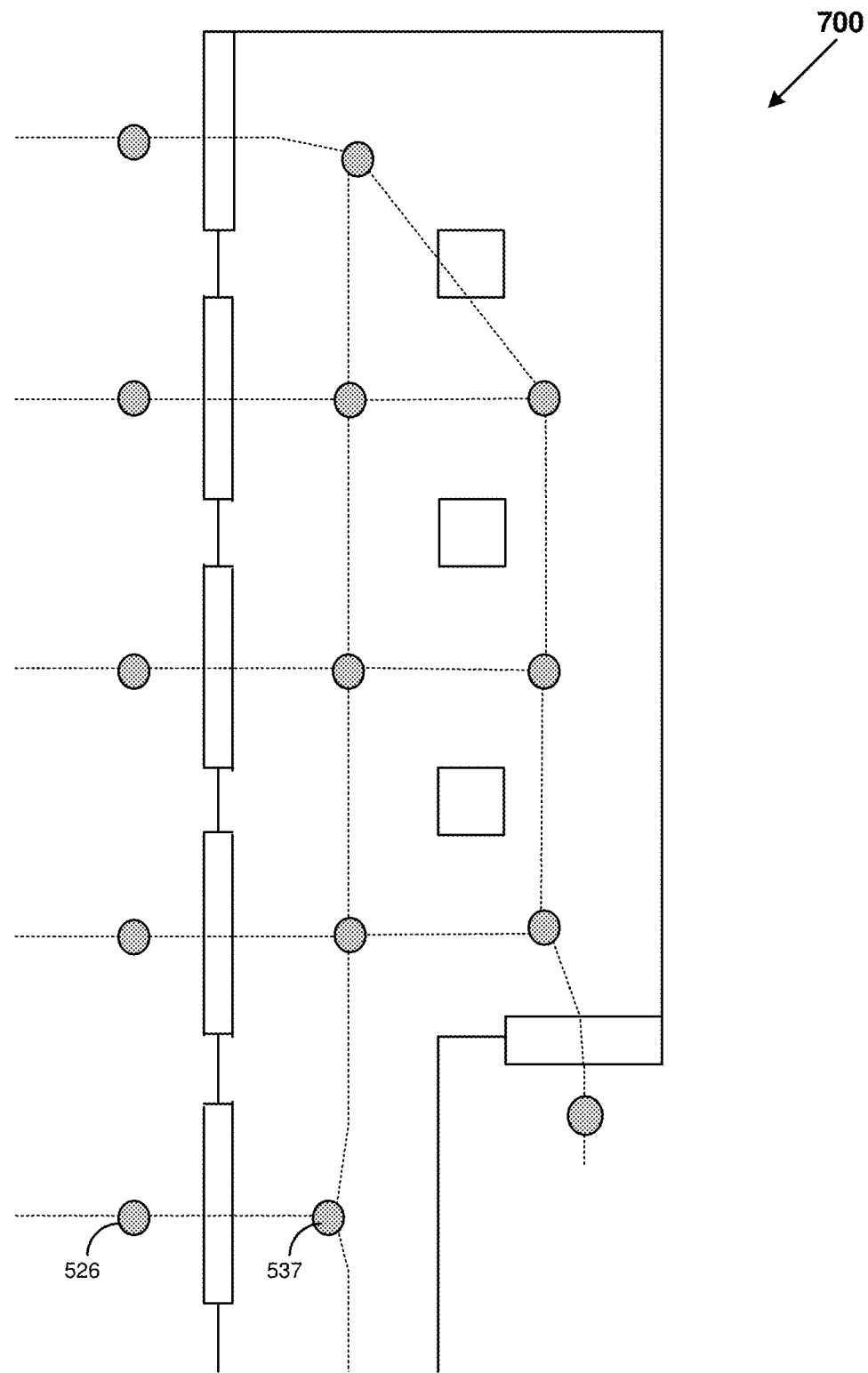
FIG. 7 illustrates an example of simplifying the resistor network for the nonhomogeneous portion.
Figure 8:
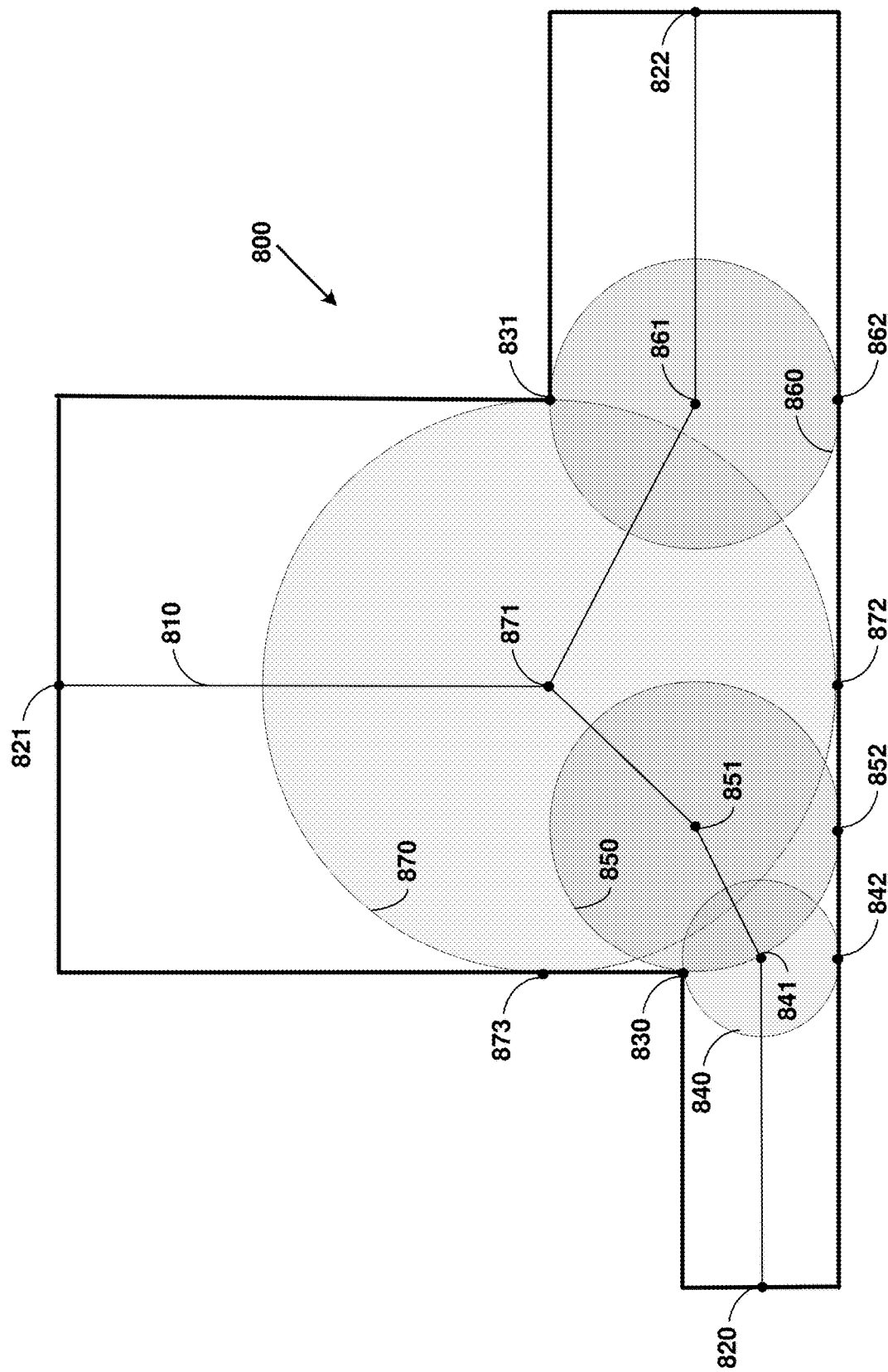
FIG. 8 illustrates another example of generating a skeleton for a portion of a conducting layer using a beachline algorithm.
Figure 9:
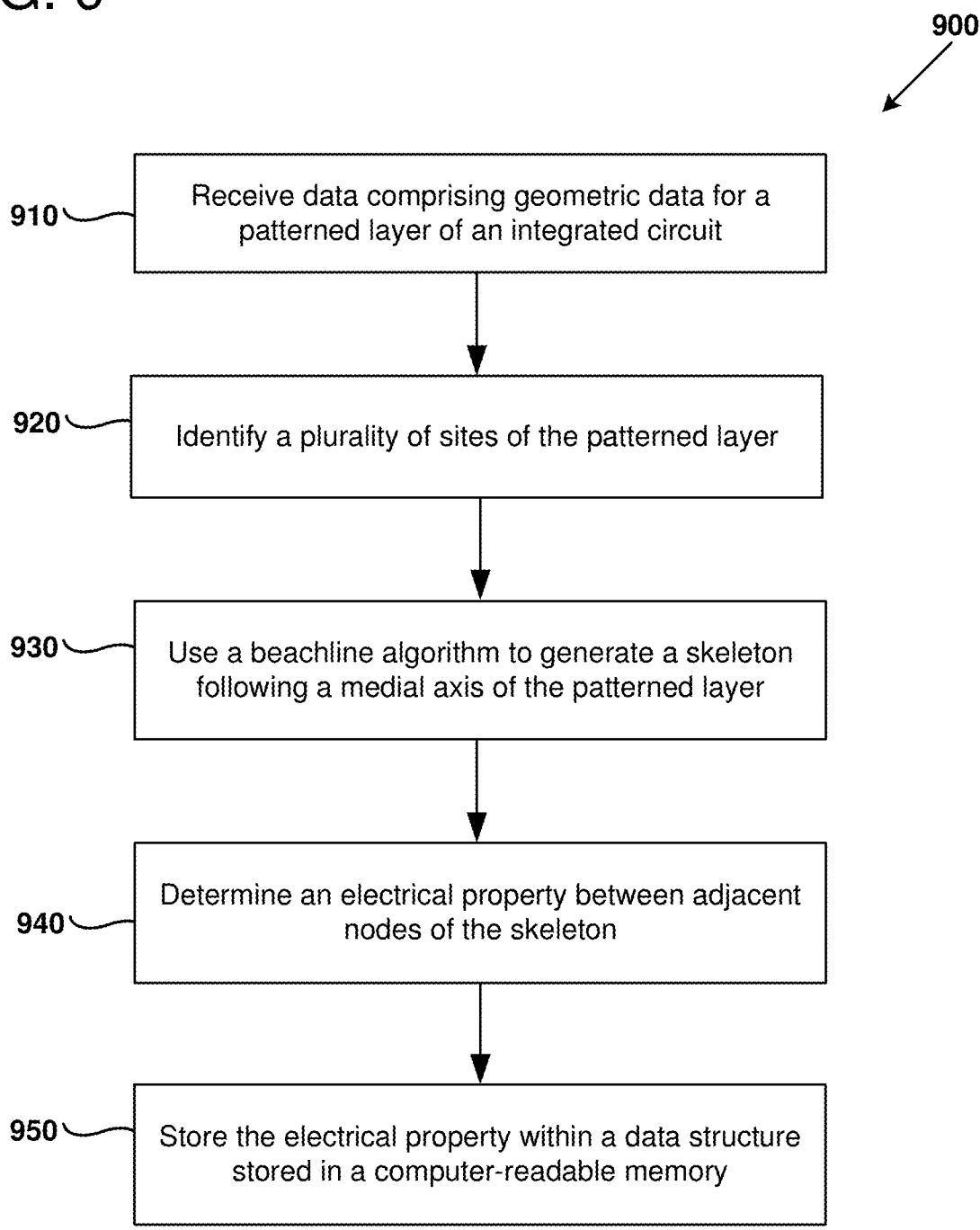
FIG. 9 is a flow diagram of an example method of extracting an electrical property of a patterned layer of an integrated circuit.

FIG. 1 is a flow diagram of an example method 100 of extracting a parasitic network for a conducting layer, such as a conducting layer of an integrated circuit. As one example, the method 100 can be implemented using hardware, software, or a combination of hardware and software executing within a computing environment, such as the computing environment 1100 of FIG. 11. FIGS. 2-7 illustrate example steps for extracting a resistance network for a specific example of a conducting layer. Specifically, FIG. 2 illustrates a layout of a conducting layer; FIG. 3 illustrates partitioning the conducting layer into homogeneous and nonhomogeneous portions; FIG. 4 illustrates adding stubs to a nonhomogeneous portion of the conducting layer; FIG. 5 illustrates generating a skeleton for the nonhomogeneous portion using a beachline algorithm; FIG. 6 illustrates generating a resistor network for the nonhomogeneous portion; and FIG. 7 illustrates simplifying the resistor network for the nonhomogeneous portion. FIG. 8 illustrates another example of generating a skeleton for a portion of a conducting layer using a beachline algorithm. FIG. 9 is a flow diagram of an example method of extracting an electrical property of a patterned layer of an integrated circuit.

Turning to FIG. 1, at 110, geometric data that is representative of a conductive layer can be received. For example, the geometric data can include an outline or a boundary of the edges of the conducting layer. The geometric data can include information about the size, position, and geometry of shapes of the conductive layer. The different shapes can represent wires within the conductive layer. The geometric data can include additional information, such as net-names and a location of contacts, vias, pins, or probe-points. A contact is a connection from one layer to another layer, such as by using a via. To form the connection, the contact will have an overlapping portion with a wire that it is connected to. The geometric data may be in any desired format, such as, for example, the Graphic Data System II (GDSII) data format or the Open Artwork System Interchange Standard (OASIS) data format proposed by Semiconductor Equipment and Materials International (SEMI). Other formats for the data 321 may include an open source format named Open Access, Milkyway by Synopsys, Inc., and EDDM by Mentor Graphics, Inc. The geometric data can be retrieved from a computer-readable memory or storage device.

At 120, the shapes of the conducting layer can be synthesized into semantic components comprising homogeneous portions and nonhomogeneous portions. Semantic components can encapsulate information about the conducting layer. For example, the conducting layer can be partitioned into areas where the current direction is known with high confidence and areas were the current direction is not known with high confidence. A homogeneous portion is an area of the conducting layer where the current flow is known with high confidence to be uniform. As a specific example, the conducting layer can be partitioned into polygons, such as rectangles and other shapes. A rectangle that is much longer than it is wide and that does not have any contacts within the rectangle will conduct current uniformly (e.g., with a constant flow) from one end of the rectangle to the other end of the rectangle. Specifically, a rectangle with a length/width ratio of two or greater and no contacts can be a homogeneous portion where the current conducts along the length of the rectangle. In some embodiments, common shapes having areas of both non-uniform and uniform flow can also be classified as homogeneous portions. For example, an L-shape without contacts can be classified as a homogeneous portion in some embodiments. Including non-rectangular shapes with the homogeneous portions may increase processing speed, but is likely to cause a reduction in accuracy. A nonhomogeneous portion is an area of the conducting layer where the current flow is not known to be uniform with high confidence. As a specific example, non-rectangular regions (e.g., T-shapes or crosses) and/or regions having contacts may be nonhomogeneous portions. Thus, synthesizing the shapes of the conducting layer into semantic components can include decomposing the geometric data into homogeneous portions and nonhomogeneous portions. A rectangular geometry with a minimum aspect ratio (length over width) and only two connections (e.g., no contacts) on the smaller opposite sides can be classified as a homogeneous portion. A non-rectangular geometry can be classified as a nonhomogeneous portion. Additionally, an area containing a contact can be classified as a nonhomogeneous portion. Synthesizing the shapes of the conducting layer into semantic components can include adding logical elements, such as interfaces between the homogeneous and nonhomogeneous portions.

Semantic components can serve as vehicles to transport information throughout the electronic design tool flow and can potentially decrease a memory footprint for a given design and increase a processing speed for the design. Semantic components can provide encapsulated entities of data to enable scalability. For example, the semantic components can potentially enable larger designs to be processed for a given electronic design tool flow. The semantic components can be represented within a data structure representing the conducting layer. For example, the semantic components can be abstractions of special configurations, such as through-silicon vias (TSVs) or meta-components of the data structure. Additionally, the semantic components can enable efficient support for back annotation.

At 130, parasitic (e.g., resistance or capacitance) values for the homogeneous portions can be determined. For example, a resistance value can be calculated based on a shape of the homogeneous portion and a resistivity of the conducting layer. As a specific example, when the homogeneous portion is a rectangle, the resistance can be the ratio of the length of the rectangle divided by the width of the rectangle, multiplied by the resistivity of the conducting layer. For more complicated shapes, such as an L shape, a lookup table can be used to calculate the resistance of the homogeneous portion.

At 140, an interface between homogeneous and nonhomogeneous portions can be added. The interface can be a logical component with a location (e.g., a point at the intersection of the homogeneous and nonhomogeneous portions), but without an area associated with it. The location of the interface can be where the constant current flow through the homogeneous portion matches the current flow through the nonhomogeneous portion. In order to make this transition smoother, the homogeneous portion may be reduced in size and the nonhomogeneous portion may be increased in size. For example, a stub can be added to a particular nonhomogeneous portion where the nonhomogeneous portion meets the homogeneous portion. The homogeneous portion can be decreased by the size of the stub and the nonhomogeneous portion can be increased by the size of the stub so that the boundary between the homogeneous and nonhomogeneous portions is adjusted to be where the stub meets the homogeneous portion. As one example, the stub can be a unit square having a width of the homogeneous portion that interfaces to the nonhomogeneous portion, where a unit square is a portion having equal length and width. In other examples, the stub can have a different aspect ratio of length to width, such as 2:1 or 3:1.

At 150, a topological shape descriptor (e.g., a topological skeleton) for the nonhomogeneous portions can be determined. For example, a shape analysis algorithm can perform a topological or statistical analysis of the geometry of the nonhomogeneous portion to produce a shape descriptor of the nonhomogeneous portion. Specifically, the shape analysis algorithm can process data representing a boundary or outline of the nonhomogeneous portion to create a shape descriptor that represents the shape of the nonhomogeneous portion. As one example, a shape analysis algorithm can be a beachline algorithm that produces a topological skeleton as its shape descriptor. The topological skeleton can include nodes representative of points within the geometry of the nonhomogeneous portion, and adjacent nodes can be interconnected by segments. As a specific example, the topological skeleton can be a medial axis of the nonhomogeneous portion.

The beachline algorithm can be a variant of Fortune's algorithm for generating Voronoi diagrams from a set of points within a plane. Fortune's algorithm is described in Steven Fortune; "A sweepline algorithm for Voronoi diagrams" *Proceedings of the second annual symposium on Computational geometry*; Yorktown Heights, N.Y., United States, pp. 313-322 (1986), which is incorporated herein by reference in its entirety. The plane for the algorithm can be the conducting layer of the integrated circuit. The set of points (also referred to as sites) used by the beachline algorithm can be determined in a number of different ways.

As one example, the sites can be located along the edges of the nonhomogeneous portion and can include various features of the nonhomogeneous portion. As one example, the sites can include corners of the portion (e.g., convex corners) and/or other points along the edges of the portion (e.g., a bisection point between two concave corners). As another example, the sites can include corners and the points on constructed circles with a maximum distance to a current sweepline. Specifically, the sweepline can cross from left to right, and the rightmost point on the circle can be inserted into the beachline algorithm as a site (event). Generally, the beachline algorithm generates a set of circles, or other shapes, that fit completely within the nonhomogeneous portion (i.e., the circles do not overlap the edges of the nonhomogeneous portion). As one example, the circles can be constructed so that they touch or are tangent to three entities, where the three entities can be three vertices (corners), two vertices and one edge, one vertex and two edges, or three edges of the nonhomogeneous portion. Thus, the circles correspond to areas within the conducting plane where current can flow without being obstructed by an edge (or corner) of the conductor. As another example, the circles can be constructed to be tangent to at least two points along edges or vertices within the nonhomogeneous portion of the conductor. Depending on the geometry, multiple circles can be added that are tangent to a given site. FIG. 5 illustrates a specific example of how the beachline algorithm can be used to fill a particular nonhomogeneous region with circles.

As one example of a beachline algorithm, a sweep line (e.g., extending from a top to a bottom of the conducting layer) can be generated that crosses from one side of the conducting layer to the other side of the conducting layer (e.g., moving from left to right along the conducting layer). The beachline is a virtual curve composed of arcs trailing the sweep line. It represents the set of shapes between the already processed part of the layout and the sweep line, which might evolve into shapes of the topological shape descriptor. When the sweep line intersects with a given site, the beachline algorithm can add one or more shapes tangent to the given site and tangent to another site or points along an edge of the patterned layer to its set of shapes. As a specific example, the shapes can be circles, but other shapes, such as ellipses, can be used. If the sweep line meets the rightmost site of a circle represented by the beachline, then the circle can be added to a set of circles to keep for the given site and the shape descriptor of the conducting layer. Some of the circles represented by the beachline can be removed without being instantiated in the shape descriptor, if one or more of the three defining entities (e.g. vertex or edge) of the circle is used by other circles previously instantiated. The circles for the conducting layer can be generated by repeating this procedure for all of the different sites within the conducting layer as the sweep line traverses across the conducting layer.

The circles generated by the beachline algorithm can be used to generate the skeleton for the nonhomogeneous portion. Specifically, the respective nodes of the skeleton include the centers of circles generated by the beachline algorithm. The nodes can also include the concave corners of the nonhomogeneous portion. The skeleton can trace the centers of the nearest-neighbor or adjacent circles so that the skeleton can follow a medial axis of the nonhomogeneous region. A contact within the nonhomogeneous region can also be assigned a node within the skeleton. For example, the contact can be assigned a node at the closest point on the skeleton to the location of the contact.

At 160, parasitic (e.g., resistance or capacitance) values can be assigned to the nonhomogeneous portions based on the skeleton. For example, resistance values can be mapped to segments connecting the nodes of the skeleton. The resistance of a segment can be a function of a radius of a first circle associated with a first node of the segment and a radius of a second circle associated with a second node of the segment. For example, a center of the first circle can be one end of the segment and a center of the second circle can be the other end of the segment. The radii of the circles can be averaged, and a resistance value can be assigned based on a length of the segment and the average of the radii of the circles. As another example, the properties of the skeleton can be used to identify areas where the current flow direction may be better determined using FEM. As a specific example, a size of a circle used by the beachline algorithm can be used to identify an area of a nonhomogeneous portion to model with finite element analysis. Specifically, FEM may potentially provide more accurate results in areas near the center of relatively larger circles. As another example, the number of circles (or centers of circles) and/or a ratio of the diameters of the circles within a given area can be used to identify an area of a nonhomogeneous portion to model with finite element analysis. The presence of more circles can indicate more complex geometries within the nonhomogeneous portion and so FEM may potentially provide more accurate results in these areas. A threshold size of a circle, a threshold ratio of diameters, and/or a threshold number of circle centers within a given area can be defined and when the number exceeds the threshold, FEM can be used to determine the current flow within the area of the nonhomogeneous portion. The generated skeleton can be used to construct a FEM mesh on-the-fly.

At 170, a circuit representation (e.g., a netlist) of the conducting layer can be generated. For example, a netlist representative of the conducting layer can be generated based on the skeleton and the assigned resistance values. In particular, each segment of the skeleton can correspond to a resistor with the resistance determined from step 160. Thus, a resistor network can be generated for the skeleton. As one example, a data structure, such as a netlist, can be generated for the resistor network formed by the nodes of the skeleton. The netlist can include a resistor for each segment within the skeleton or the netlist can be simplified so that the netlist can be stored in a more compact form. Specifically, node reduction can be performed within the skeleton by combining at least some of the series connections within the skeleton. For example, a series connection having no contacts can be reduced between parallel connection points. The reduction can include adding the resistors in the series to generate the equivalent resistor. As another example, series connections between adjacent contacts or between a parallel branch and a contact can be reduced to an equivalent resistance. By maintaining a node for each contact, the resistance to the contact can be calculated at later steps in the electronic design flow.

The circuit representation can also include capacitance data that is generated in a similar manner to the resistance data. Whereas the resistance of the conducting layer is a function of the geometry within the conducting layer, the parasitic capacitance of the conducting layer can be a function of the geometry between different portions of the conducting layer. For example, there is a parasitic capacitance between parallel wires within the conducting layer. Thus, a skeleton can be generated for the dielectric layer between the conducting wires using the beachline algorithm. Capacitance can be mapped to a segment of the skeleton based on the length of the segment and a function of the radii of the circle's centers forming the endpoints of the segment. The capacitance data can be added to the netlist with the resistors to complete the resistive and capacitive extraction.

FIGS. 2-7 illustrate a specific example of how a given conducting layer can be processed to extract a resistance network for the conducting layer. FIG. 2 illustrates an example layout for a conducting layer 200 comprising homogeneous portions (210, 220, 230, 240, 250, and 260) and a nonhomogeneous portion 270. The homogeneous portions (210, 220, 230, 240, 250, and 260) are rectangular regions where the length of the region is greater than twice a width of the region. Current can flow along the length of the homogeneous portions (210, 220, 230, 240, 250, and 260) from one end of the conductor to the other end of the conductor. The nonhomogeneous portion 270 includes a non-rectangular shape with cutouts and intersections with the homogeneous portions (210, 220, 230, 240, 250, and 260). The homogeneous portions (210, 220, 230, 240, and 250) can extend to an interface with the nonhomogeneous portion 270. As one example, the homogeneous portions (210, 220, 230, 240, and 250) can extend the entire length of the rectangular region. As another example, the homogeneous portions (210, 220, 230, 240, and 250) can be reduced in size to account for the nonhomogeneous current flow at the interface between the homogeneous portions and the nonhomogeneous portion 270. In particular, and as further illustrated in FIG. 5, a stub can be added to the nonhomogeneous portion 270 at the interface to the homogeneous portions (210, 220, 230, 240, and 250) and the stub can be removed from the homogeneous portions (210, 220, 230, 240, and 250) to account for potentially nonhomogeneous current flow.

FIG. 3 further illustrates how the conducting layer can be partitioned into different portions corresponding to the homogeneous and nonhomogeneous portions to generate an annotated representation 300 of the conducting layer. In the representation 300, the homogeneous portions have been transformed into segments (310, 320, 330, 340, 350, and 360) of known resistance and current flow. Specifically, the current will flow from one end of a respective segment to the other end of the segment. The resistance of the segment will be a ratio of the length of the conductor to the width of the conductor, multiplied by the resistivity of the conductor. The boundaries (312, 322, 332, 342, 352, and 362) of the homogeneous portions can be treated as nonhomogeneous portions. The segments (310, 320, 330, 340, 350, and 360) corresponding to the homogeneous portions intersect the nonhomogeneous portion 370 at the respective interfaces (314, 324, 334, 344, 354, and 364).

FIG. 4 illustrates an example of adding stubs to the nonhomogeneous portion at the respective interfaces to the homogeneous portions to create an amended nonhomogeneous portion 470. Specifically the stubs (410, 420, 430, 440, 450, and 460) can be added at the interfaces to the homogeneous portions to account for potential non-constant current flow at the interfaces. The stubs can be various sizes such as a unit stub with a length equal to its width. The width of the stub can be the width of the homogeneous portion that interfaces to the nonhomogeneous portion. The size of the homogeneous portion (and hence its resistance) can be reduced to account for the size of the stub added to the nonhomogeneous portion. By adding the stubs to the nonhomogeneous portion, the current flow at the interface to the homogeneous portions can be more uniform than compared to a nonhomogeneous portion without stubs. Thus, adding the stubs can potentially enable a more accurate representation of the current flowing through the conducting layer.

FIG. 5 illustrates an example of generating an annotated amended nonhomogeneous portion 570 using a beachline algorithm. The beachline algorithm can be used to generate circles representing uninterrupted current flow, and the centers of the circles can be used as nodes of a skeleton 510 (represented by the dashed line) that follows a medial axis of the nonhomogeneous region. It should be noted, that for ease of illustration, only a portion of the circles generated by the beachline algorithm are shown in the annotated amended nonhomogeneous portion 570. Sites used by the beachline algorithm can include the sites 520, 530, and 540.

The site 520 bisects the edge connecting the convex corners 521 and 522. The circle 523 is tangent to the site 520 and to the points 524 and 525 along edges of the conductor. The center 526 of the circle 523 can be a node of the skeleton 510 that connects to the convex corners 521 and 522. The circle 523 is the only circle that can be drawn tangent to the site 520 and remain within the edges of the conductor.

The site 530 is located at a concave corner of the conductor. Three circles can be tangent to the site 530 and other points along the edges of the conductor. The circle 531 with a center at 532 can have a tangent point at the site 540. The circle 533 with a center at 534 can have a tangent point 535 along an edge of the conductor. The circle 536 with a center at 537 can have a tangent point 538 along the edge of the conductor.

The site 540 is located at a concave corner of the conductor. Three circles can be tangent to the site 540 and other points along the edges of the conductor. The circle 531 with a center at 532 can have a tangent point at the site 530. It should be noted that the circle 531 can be generated using either the site 540 or the site 530 as a starting point. The circle 543 with a center at 544 can have a tangent point 545 along an edge of the conductor. The circle 536 with a center at 537 can have a tangent point 538 along the edge of the conductor.

The convex corners and/or the centers of the circles are used as nodes of the skeleton 510. For example, the skeleton 510 can be generated by connecting the convex corner 521 to the center 526 with a first segment, and connecting the center 526 to the center 532 and to the center 537. A parallel branch is present at the center 537. Along one branch, the center 537 can be connected to the center 534. Along the other branch, the center 537 can be connected to the center 544. It should be noted that the connections to the convex corners are not used for generating the resistance-network (since there is not current flowing toward the convex corner). However, the connections to the convex corners can be used to provide topological information which can be used FEM meshing, for example.

The beachline algorithm can continue to generate the skeleton 510 by generating circles at the sites and connecting the centers of the circles together in a sequential pattern to form the skeleton 510. The centers of the circles can be connected with segments that can be straight lines and/or with lines generated from higher order polynomials, such as quadratic polynomials. The choice of how to connect the centers of the circles can be based on an amount of overlap of the circles and/or a number of overlapping circles within a given region, for example.

The segments connecting the centers of the circles (i.e., the nodes) of the skeleton 510 have a resistance associated with the segment. A value of the resistance can be a function of the radii of the circles connecting the nodes of the segment and a length of the segment. For example, the resistance of the segment connecting the nodes 526 and 532 can be a function of the radii of the circles 523 and 531 and a function of the length of the segment. Specifically, the resistance of the segment connecting the nodes 526 and 532 can be a function of an average radius of the circles 523 and 531 and the distance between the nodes 526 and 532. A resistance of the other nodes can be calculated in a similar manner such that the respective segments with endpoint nodes (532, 537), (537, 534), (537, 544), and so forth are assigned a corresponding resistance.

FIG. 6 illustrates an example of the nonhomogeneous portion annotated with a resistor network 600. Specifically, the resistor network 600 will have a corresponding node for each of the nodes of the skeleton 510. The resistors between the nodes correspond to the resistance calculated for each of the segments connecting the nodes of the skeleton 510. For example, a resistor connects each of the node pairs (526, 532), (532, 537), (537, 534), (537, 634), and so forth. The resistance of the stubs can be allocated to the nonhomogeneous portion or the homogeneous portion.

FIG. 7 illustrates an example of the nonhomogeneous portion annotated with a simplified resistor network 700. Specifically, the resistor network 600 can be reduced so that the resistor network 700 can be stored in a more compact form and can be processed more efficiently. The series connections within the resistor network 600 can be combined by adding the series resistors together. As a specific example, the node 532, which is in series with nodes 526 and 537, has been removed from the resistor network 700. The resistance between the nodes 526 and 537 remains the same, which is the sum of the resistance between nodes (526, 532) and (532, 537). In one embodiment, nodes associated with a contact will be maintained (e.g., not simplified) so that the resistance to the contact can be calculated with a higher accuracy. The resistor network 700 can be combined with the resistors calculated for the homogeneous portions to create a resistor network (not shown) for the entire conducting layer.

FIG. 8 illustrates another example of generating a skeleton 810 for the nonhomogeneous portion 800 of a conducting layer using a beachline algorithm. In this example, the nonhomogeneous portion 800 may include homogeneous portions. The nonhomogeneous portion 800 may connect to other nonhomogeneous portions or to homogenous portions of a conducting layer at the edges having bisecting points 820, 821, and 822. The sweep line can sweep from the point 820 toward the point 822. The sites can include convex corners of the nonhomogeneous portion 800, such as sites 830 and 831. When the sweep line encounters a site 830 or 831, the algorithm can add one or more circles that are tangent to the site and an edge of the nonhomogeneous portion 800. As one example, the circle 840, having center 841, can be tangent to the site 830 and the point 842 along an edge of the nonhomogeneous portion 800. The circle 850, having center 851, can be tangent to the site 830 and the point 852 along an edge of the nonhomogeneous portion 800. As another example, the circle 860, having center 861, can be tangent to the site 831 and the point 862 along an edge of the nonhomogeneous portion 800. The circle 870, having center 871, can be tangent to the site 831 and the points 872 and 873 along different edges of the nonhomogeneous portion 800. The bisector points 820-822 and the circle centers 841, 851, 861, and 871 can be nodes of the skeleton 810. Resistance values can be assigned to the segments connecting the nodes of the skeleton. The resistance values can be functions of the resistivity of the nonhomogeneous portion 800, a length of the respective segment, and a function of the radii of circles at the nodes of the segment.

FIG. 9 is a flow diagram of another example method 900 of extracting an electrical property of a patterned layer of an integrated circuit. As one example, the method 900 can be implemented using hardware, software, or a combination of hardware and software executing within a computing environment, such as the computing environment 1100 of FIG. 11.

At 910, data comprising geometric data for a patterned layer of an integrated circuit can be received. For example, the geometric data can represent conductive portions and/or dielectric portions of the patterned layer. The geometric data may be in any desired format, such as, for example, the Graphic Data System II (GDSII) data format or the Open Artwork System Interchange Standard (OASIS) data format proposed by Semiconductor Equipment and Materials International (SEMI). Other formats for the data 321 may include an open source format named Open Access, Milkyway by Synopsys, Inc., and EDDM by Mentor Graphics, Inc. The geometric data can be retrieved from a computer-readable memory or storage device.

At 920, sites of the patterned layer can be identified. The sites can include corners or other features of the patterned layer. The sites can include convex corners and/or concave corners. The sites can include bisection points between adjacent convex corners. The sites can be used as an input to a beachline algorithm.

At 930, a beachline algorithm can be used to generate a skeleton following a medial axis of the patterned layer. The skeleton can include multiple nodes, where a respective node can be centered at a circle that is tangent to a respective site and a point along an edge of the patterned layer. The beachline algorithm can generate multiple circles corresponding to each site. For example, the beachline algorithm can generate a sweep line (e.g., extending from a top to a bottom of the patterned layer) that crosses from one side of the patterned layer to the other side of the patterned layer (e.g., moving from left to right along the patterned layer). The beachline is a virtual curve composed of arcs trailing the sweep line. It represents the set of shapes between the already processed part of the patterned layer and the sweep line, which might evolve into shapes of the topological shape descriptor. When the sweep line intersects with a given site, the beachline algorithm can add one or more shapes tangent to the given site and tangent to another site or points along an edge of the patterned layer to its set of shapes. As a specific example, the shapes can be circles, but other shapes, such as ellipses, can be used. If the sweep line meets the rightmost site of a circle represented by the beachline, then the circle can be added to a set of circles to keep for the given site and the shape descriptor of the patterned layer. Some of the circles represented by the beachline can be removed without being instantiated in the shape descriptor, if one or more of the three defining entities (e.g. vertex or edge) of the circle is used by other circles previously instantiated. The circles for the patterned layer can be generated by repeating this procedure for all of the different sites within the patterned layer as the sweep line traverses across the patterned layer. The centers of the circles can be the nodes of the skeleton.

At 940, an electrical property between adjacent nodes of the skeleton can be determined. For example, the electrical property can be resistance (for a conductor) or capacitance (for a dielectric). The electrical property can be a function of a distance between the adjacent nodes of the skeleton. Additionally, the electrical property can be a function of a geometric property of the circles used to create the nodes of the skeleton. The geometric property of the circles can be a radius, a diameter, an area, and so forth. As a specific example, the electrical property between adjacent nodes of the skeleton can be proportional to a distance between the adjacent nodes multiplied by an average of the radii of the circles associated with the respective adjacent nodes.

At 950, the determined electrical property can be stored in a computer-readable memory. For example, the computer-readable memory can be configured with a data structure representative of the patterned layer. The data structure can be a netlist, for example. The data structure can be accessed by other electronic design automation software tools. For example, the patterned layer can be part of a microcircuit, and the microcircuit can be simulated using the electrical properties stored in the netlist. As another example, an electromigration tool can determine whether the microcircuit may encounter any potential issues with operational lifetime, such as by calculating current densities through the patterned layer. The data structure generated by the beachline algorithm can potentially condense or compact the information used to simulate the microcircuit while providing relatively good accuracy. A more compact representation can reduce a memory footprint used by the electronic design automation software tools and can potentially decrease a processing time for the electronic design automation software tools for a given microcircuit.

Electronic Design Automation Environment

Various examples of the disclosed subject matter are related to electronic design automation. In particular, various examples can be used to improve the operation of electronic design automation software tools that identify, verify and/or modify design data for manufacturing a microdevice, such as a microcircuit. As used herein, the terms "design" and "design data" are intended to encompass data describing an entire microdevice, such as an integrated circuit device or micro-electromechanical system (MEMS) device. This term also is intended to encompass a smaller set of data describing one or more components of an entire microdevice, however, such as a layer of an integrated circuit device, or even a portion of a layer of an integrated circuit device. Still further, the terms "design" and "design data" also are intended to encompass data describing more than one microdevice, such as data to be used to create a mask or reticle for simultaneously forming multiple microdevices on a single wafer. It should be noted that, unless otherwise specified, the term "design" as used herein is intended to encompass any type of design, including both a physical layout design and a logical design.

Designing and fabricating microcircuit devices involve many steps during a "design flow" process. These steps can be highly dependent on the type of microcircuit, its complexity, the design team, and the fabricator or foundry that will manufacture the microcircuit from the design. However, several steps are common to most design flows. First, a design specification is modeled logically, typically in a hardware design language (HDL). Once a logical design has been created, various logical analysis processes are performed on the design to verify its correctness. More particularly, software and hardware "tools" verify that the logical design will provide the desired functionality at various stages of the design flow by running software simulators and/or hardware emulators, and errors are corrected. For example, a designer may employ one or more functional logic verification processes to verify that, given a specified input, the devices in a logical design will perform in the desired manner and provide the appropriate output.

In addition to verifying that the devices in a logic design will provide the desired functionality, some designers may employ a design logic verification process to verify that the logical design meets specified design requirements. For example, a designer may create rules such as, e.g., every transistor gate in the design must have an electrical path to ground that passes through no more than three other devices, or every transistor that connects to a specified power supply also must be connected to a corresponding ground node, and not to any other ground node. A design logic verification process then will determine if a logical design complies with specified rules, and identify occurrences where it does not.

After the logical design is deemed satisfactory, it is converted into physical design data by synthesis software. This physical design data or "layout" design data may represent, for example, the geometric elements that will be written onto a mask used to fabricate the desired microcircuit device in a photolithographic process at a foundry. For conventional mask or reticle writing tools, the geometric elements typically will be polygons of various shapes. Thus, the layout design data usually includes polygon data describing the features of polygons in the design. It is very important that the physical design information accurately embody the design specification and logical design for proper operation of the device. Accordingly, after it has been created during a synthesis process, the physical design data is compared with the original logical design schematic in a process sometimes referred to as a "layout-versus-schematic" (LVS) process.

The physical design can introduce additional properties into the design. For example, the physical wires connecting different logical elements of the design can include parasitic resistors, parasitic capacitors, and parasitic inductors. A parasitic extraction software tool (also referred to as an XRC tool for "eXtract Resistors and Capacitors") can be used to calculate or "extract" the parasitic resistors, capacitors, and inductors of the wires of the design. The parasitic resistors, capacitors, and inductors will affect a speed of signals propagating from one logic circuit to another logic circuit. The changes in timing due to the parasitic elements can potentially introduce timing violations into the design that, if not corrected, can make the design malfunction. A static timing tool can be used to calculate a cycle time for a set of logic paths and identify any timing paths that can potentially violate setup or hold times of a sequential logic element (such as a flip-flop). Additionally, the effects of the parasitic elements can be annotated onto the logic paths so that the design can be simulated (this can be referred to as simulating with "gates") with the more accurate timing information to verify that the design functions correctly.

Once the correctness of the logical design has been verified, and geometric data corresponding to the logical design has been created in a layout design, the geometric data then can be analyzed using additional checks. For example, because the physical design data is employed to create masks used at a foundry, the data must conform to the foundry's requirements. Each foundry specifies its own physical design parameters for compliance with their processes, equipment, and techniques. Accordingly, the design flow may include a process to confirm that the design data complies with the specified parameters. During this process, the physical layout of the circuit design is compared with design rules in a process commonly referred to as a "design rule check" (DRC) process. In addition to rules specified by the foundry, the design rule check process may also check the physical layout of the circuit design against other design rules, such as those obtained from test chips, general knowledge in the industry, previous manufacturing experience, or other sources of design rules.

The parasitic resistors and capacitors can also be used in various "design-for-reliability" (DFR) software tools, such as an electromigration (EM) checker. The EM effect is the transport of material caused by the gradual movement of ions in a conductor, due to the momentum transfer between conducting electrons and diffusing metal atoms. The EM effect can be important in applications where relatively high direct current densities are used, such as in microelectronics and related structures. The EM checker can analyze the current flow of conducting layers within the physical design using the parasitic resistors and capacitors of the design. The EM checker can identify potentially problematic areas (e.g., areas where current flow exceeds a threshold for a given layer type) and/or modify the physical design to reduce the current flow through the potentially problematic areas. Thus, the parasitic resistors and capacitors can be used by a process to potentially increase the operational lifetime of the manufactured design by improving the electromigration characteristics of the physical design.

With modern electronic design automation design flows, a designer may additionally employ one or more "design-for-manufacture" (DFM) software tools. As previously noted, design rule check processes attempt to identify, for examples, layout features representing structures that will almost certainly be improperly formed during a manufacturing process. "Design-For-Manufacture" tools, however, provide processes that attempt to identify elements in a design representing structures with a significant likelihood of being improperly formed during the manufacturing process. A "design-for-manufacture" process may additionally determine what impact the improper formation of the identified elements will have on the yield of devices manufactured from the circuit design, and/or modifications that will reduce the likelihood that the identified elements will be improperly formed during the manufacturing process. For example, a "design-for-manufacture" (DFM) software tool may identify wires that are connected by only a single via, determine the yield impact for manufacturing a circuit from the design based upon the probability that each individual single via will be improperly formed during the manufacturing process, and then identify areas where redundant vias can be formed to supplement the single vias.

It should be noted that, in addition to "design-for-manufacture," various alternate terms are used in the electronic design automation industry. Accordingly, as used herein, the term "design-for-manufacture" or "design-for-manufacturing" is intended to encompass any electronic design automation process that identifies elements in a design representing structures that may be improperly formed during the manufacturing process. Thus, "design-for-manufacture" (DFM) software tools will include, for example, "lithographic friendly design" (LFD) tools that assist designers to make trade-off decisions on how to create a circuit design that is more robust and less sensitive to lithographic process windows. They will also include "design-for-yield" (DFY) electronic design automation tools, "yield assistance" electronic design automation tools, and "chip cleaning" and "design cleaning" electronic design automation tools.

After a designer has used one or more geometry analysis processes to verify that the physical layout of the circuit design is satisfactory, the designer may then perform one or more simulation processes to simulate the operation of a manufacturing process, in order to determine how the design will actually be realized by that particular manufacturing process. A simulation analysis process may additionally modify the design to address any problems identified by the simulation. For example, some design flows may employ one or more processes to simulate the image formed by the physical layout of the circuit design during a photolithographic process, and then modify the layout design to improve the resolution of the image that it will produce during a photolithography process.

These resolution enhancement techniques (RET) may include, for example, modifying the physical layout using optical proximity correction (OPC) or by the addition of sub-resolution assist features (SRAF). Other simulation analysis processes may include, for example, phase shift mask (PSM) simulation analysis processes, etch simulation analysis processes and planarization simulation analysis processes. Etch simulation analysis processes simulate the removal of materials during a chemical etching process, while planarization simulation processes simulate the polishing of the circuit's surface during a chemical-mechanical etching process. These simulation analysis processes may identify, for example, regions where an etch or polishing process will not leave a sufficiently planar surface. These simulation analysis processes may then modify the physical layout design to, e.g., include more geometric elements in those regions to increase their density.

Once a physical layout design has been finalized, the geometric elements in the design are formatted for use by a mask or reticle writing tool. Masks and reticles typically are made using tools that expose a blank reticle or mask substrate to an electron or laser beam (or to an array of electron beams or laser beams), but most mask writing tools are able to only "write" certain kinds of polygons, however, such as right triangles, rectangles or other trapezoids. Moreover, the sizes of the polygons are limited physically by the maximum beam (or beam array) size available to the tool. Accordingly, the larger geometric elements in a physical layout design data will typically be "fractured" into the smaller, more basic polygons that can be written by the mask or reticle writing tool.

It should be appreciated that various design flows may repeat one or more processes in any desired order. Thus, with some design flows, geometric analysis processes can be interleaved with simulation analysis processes and/or logical analysis processes. For example, once the physical layout of the circuit design has been modified using resolution enhancement techniques, then a design rule check process or design-for-manufacturing process may be performed on the modified layout, Further, these processes may be alternately repeated until a desired degree of resolution for the design is obtained. Similarly, a design rule check process and/or a design-for-manufacturing process may be employed after an optical proximity correction process, a phase shift mask simulation analysis process, an etch simulation analysis process or a planarization simulation analysis process.

Software Tools for Simulation, Verification or Modification of a Circuit Layout

To facilitate an understanding of various embodiments of the disclosed technology, one such software tool for automatic design automation, directed to the analysis and modification of a design for an integrated circuit, will now be generally described. As previously noted, the terms "design" and "design data" are used herein to encompass data describing an entire microdevice, such as an integrated circuit device or micro-electromechanical system (MEMS) device. These terms also are intended, however, to encompass a smaller set of data describing one or more components of an entire microdevice, such as a layer of an integrated circuit device, or even a portion of a layer of an integrated circuit device. Still further, the terms "design" and "design data" also are intended to encompass data describing more than one microdevice, such as data to be used to create a mask or reticle for simultaneously forming multiple microdevices on a single wafer. As also previously noted, unless otherwise specified, the term "design" as used herein is intended to encompass any type of design, including both physical layout designs and logical designs.

Figure 10:
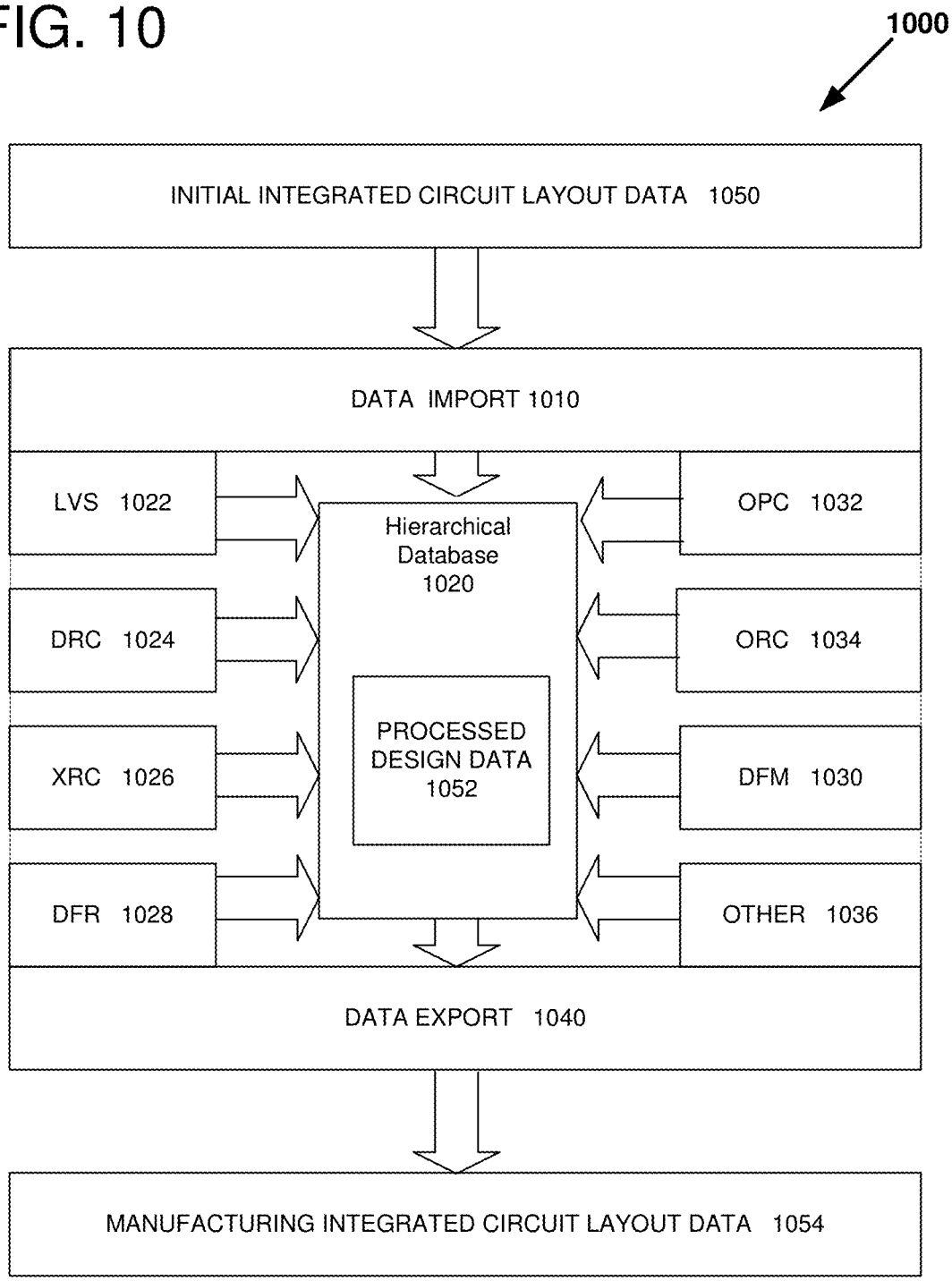
FIG. 10 illustrates an example of an electronic design flow that uses a hierarchical database.

As seen in FIG. 10, an analysis tool 1000, which may be implemented by a variety of different software applications, includes a data import module 1010 and a hierarchical database 1020. The analysis tool 1000 also includes a layout-versus-schematic (LVS) verification module 1022, a design rule check (DRC) module 1024, an extract-resistance-and-capacitance (XRC) module 1026, a design-for-reliability (DFR) module 1028, a design-for-manufacturing (DFM) module 1030, an optical proximity correction (OPC) module 1032, and an optical proximity rule check (ORC) module 1034. The analysis tool 1000 may further include other modules 1036 for performing additional functions as desired, such as a phase shift mask (PSM) module (not shown), an etch simulation analysis module (not shown) and/or a planarization simulation analysis module (not shown). The tool 1000 also has a data export module 1040. One example of such an analysis tool is the Calibre family of software applications available from Mentor Graphics Corporation of Wilsonville, Oreg.

Initially, the tool 1000 receives data 1050 describing a physical layout design for an integrated circuit. The layout design data 1050 may be in any desired format, such as, for example, the Graphic Data System II (GDSII) data format or the Open Artwork System Interchange Standard (OASIS) data format proposed by Semiconductor Equipment and Materials International (SEMI). Other formats for the data 1050 may include an open source format named Open Access, Milkyway by Synopsys, Inc., and EDDM by Mentor Graphics, Inc. The layout data 1050 includes geometric elements for manufacturing one or more portions of an integrated circuit device. For example, the initial integrated circuit layout data 1050 may include a first set of polygons for creating a photolithographic mask that in turn will be used to form an isolation region of a transistor, a second set of polygons for creating a photolithographic mask that in turn will be used to form a contact electrode for the transistor, and a third set of polygons for creating a photolithographic mask that in turn will be used to form an interconnection line (i.e., a conductor) to the contact electrode. The initial integrated circuit layout data 1050 may be converted by the data import module 1010 into a format that can be more efficiently processed by the remaining components of the tool 1000.

Once the data import module 1010 has converted the original integrated circuit layout data 1050 to the appropriate format, the processed layout data 1052 is stored in the hierarchical database 1020 for use by the various operations executed by the modules 1022-1036. Next, the layout-versus-schematic module 1022 checks the layout design data 1052 in a layout-versus-schematic process, to verify that it matches the original design specifications for the desired integrated circuit. If discrepancies between the layout design data 1052 and the logical design for the integrated circuit are identified, then the layout design data 1052 may be revised to address one or more of these discrepancies. Thus, the layout-versus-schematic process performed by the layout-versus-schematic module 1022 may lead to a new version of the layout design data with revisions. According to various implementations of the tool 1000, the layout data 1052 may be manually revised by a user, automatically revised by the layout-versus-schematic module 1022, or some combination thereof.

Next, the design rule check module 1024 confirms that the verified layout data 1052 complies with defined geometric design rules. If portions of the layout data 1052 do not adhere to or otherwise violate the design rules, then the layout data 1052 may be modified to ensure that one or more of these portions complies with the design rules. The design rule check process performed by the design rule check module 1024 thus also may lead to a new version of the layout design data with various revisions. Again, with various implementations of the tool 1000, the layout data 1052 may be manually modified by a user, automatically modified by the design rule check module 1024, or some combination thereof.

The modified layout data 1052 can be processed by the parasitic extraction software module (XRC) 1026. As previously noted, the XRC module 1026 can perform a series of steps to extract parasitic resistors and capacitors from the geometric information of the modified layout data 1052. As one example, the XRC module 1026 can decompose the geometric data of the conducting (or dielectric) layers into homogeneous portions and nonhomogeneous portions; use a beachline algorithm to generate a skeleton comprising nodes within the nonhomogeneous portions; map resistance (or capacitance) values to segments connecting the nodes of the skeleton; and generate a data structure (e.g., a netlist) representative of the conducting layer based on the skeleton and the mapped resistance and/or capacitance values. The netlist can be added to the modified layout data 1052 so that other modules within the tool 1000 can access the parasitic characteristics of the layout data 1052.

The modified layout data 1052 can be processed by the design-for-reliability software tool (DFR) 1028. A "design-for-reliability" processes attempts to identify elements in a design representing structures with a significant likelihood of shortening an operational lifetime of the manufactured design. As one example, a "design-for-reliability" process may include an electromigration (EM) module that identifies areas of the design where current flow per unit width may exceed design guidelines. The EM module can identify structures where the EM effect may potentially cause a failure of the design and/or the EM module can automatically add corrective measures for the design. For example, the EM module can correct areas of high current density by widening conductors in an area of high current density, moving cutouts and/or contacts, re-routing the affected routing net and/or neighboring routing nets, adding parallel connections, and so forth. The automatic and/or manual modifications can be propagated into the modified layout data 1052.

The modified layout data 1052 is then processed by the design for manufacturing module 1030. As previously noted, a "design-for-manufacture" process attempts to identify elements in a design representing structures with a significant likelihood of being improperly formed during the manufacturing process. A "design-for-manufacture" process may additionally determine what impact the improper formation of the identified structures will have on the yield of devices manufactured from the circuit design, and/or modifications that will reduce the likelihood that the identified structures may be improperly formed during the manufacturing process. For example, a "design-for-manufacture" (DFM) software tool may identify wires that are connected by single vias, determine the yield impact based upon the probability that each individual single via will be improperly formed during the manufacturing process, and then identify areas where redundant visa can be formed to supplement the single vias.

The processed layout data 1052 is then passed to the optical proximity correction (OPC) module 1032, which corrects the layout data 1052 for manufacturing distortions that would otherwise occur during the lithographic patterning. For example, the optical proximity correction module 1032 may correct for image distortions, optical proximity effects, photoresist kinetic effects, and etch loading distortions. The layout data 1052 modified by the optical proximity correction module 1032 then is provided to the optical process rule check module 1034.

The optical process rule check module 1034 (more commonly called the optical rules check module or ORC module) ensures that the changes made by the optical proximity correction module 1032 are actually manufacturable, a "downstream-looking" step for layout verification. This compliments the "upstream-looking" step of the LVS performed by the LVS module 1022 and the self-consistency check of the DRC process performed by the DRC module 1024, adding symmetry to the verification step. Thus, each of the processes performed by the design for manufacturing process 1030, design for manufacturing reliability module 1028, the optical proximity correction module 1032, and the optical process rule check module 1034 may lead to a new version of the layout design data with various revisions.

As previously noted, other modules 1036 may be employed to perform alternate or additional manipulations of the layout data 1052, as desired. For example, some implementations of the tool 1000 may employ, for example, a phase shift mask module. As previously discussed, with a phase-shift mask (PSM) analysis (another approach to resolution enhancement technology (RET)), the geometric elements in a layout design are modified so that the pattern they create on the reticle will introduce contrast-enhancing interference fringes in the image. The tool 1000 also may alternately or additionally employ, for example, an etch simulation analysis processes or a planarization simulation analysis processes. The process or processes performed by each of these additional modules 1036 may also lead to the creation of a new version of the layout data 1052 that includes revisions.

After all of the desired operations have been performed on the initial layout data 1050, the data export module 1040 converts the processed layout data 1052 into manufacturing integrated circuit layout data 1054 that can be used to form one or more masks or reticules to manufacture the integrated circuit (that is, the data export module 1040 converts the processed layout data 1052 into a format that can be used in a photolithographic manufacturing process). Masks and reticles typically are made using tools that expose a blank reticle or mask substrate to an electron or laser beam (or to an array of electron beams or laser beams), but most mask writing tools are able to only "write" certain kinds of polygons, however, such as right triangles, rectangles or other trapezoids. Moreover, the sizes of the polygons are limited physically by the maximum beam (or beam array) size available to the tool.

Accordingly, the data export module 1040 may "fracture" larger geometric elements in the layout design, or geometric elements that are not right triangles, rectangles or trapezoids (which typically are a majority of the geometric elements in a layout design) into the smaller, more basic polygons that can be written by the mask or reticle writing tool. Of course, the data export module 1040 may alternately or additionally convert the processed layout data 1052 into any desired type of data, such as data for use in a synthesis process (e.g., for creating an entry for a circuit library), data for use in a place-and-route process, data for use in calculating parasitic effects, etc. Further, the tool 1000 may store one or more versions of the layout 1052 containing different modifications, so that a designer can undo undesirable modifications. For example, the hierarchical database 1020 may store alternate versions of the layout data 1052 created during any step of the process flow between the modules 1022-1036.

Example Computing Environment

Figure 11:
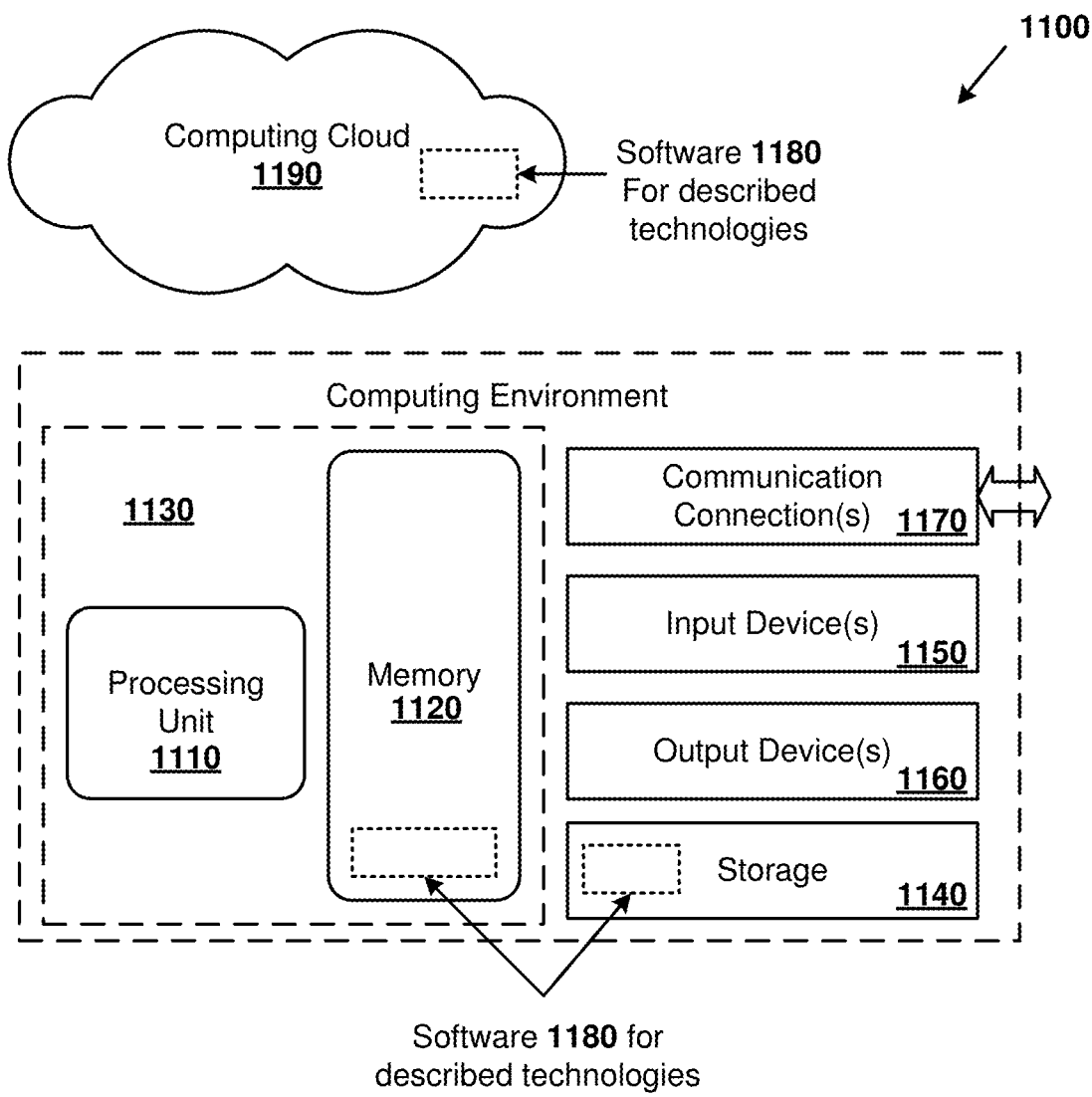
FIG. 11 depicts a generalized example of a suitable computing environment in which the described innovations may be implemented

FIG. 11 illustrates a generalized example of a suitable computing environment 1100 in which described embodiments, techniques, and technologies, including parasitic extraction and electromigration analysis can be implemented. For example, the computing environment 1100 can implement any of the analysis operations, as described herein.

The computing environment 1100 is not intended to suggest any limitation as to scope of use or functionality of the technology, as the technology may be implemented in diverse general-purpose or special-purpose computing environments. For example, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 11, the computing environment 1100 includes at least one central processing unit 1110 and memory 1120. In FIG. 11, this most basic configuration 1130 is included within a dashed line. The central processing unit 1110 executes computer-executable instructions and may be a real or a virtual processor. In a multi-processing system, multiple processing units execute computer-executable instructions to increase processing power and as such, multiple processors can be running simultaneously. The memory 1120 may be volatile memory (e.g., registers, cache, RAM), non-volatile memory (e.g., ROM, EEPROM, flash memory, etc.), or some combination of the two. The memory 1120 stores software 1180, images, and layout design data that can, for example, implement the technologies described herein. A computing environment may have additional features. For example, the computing environment 1100 includes storage 1140, one or more input devices 1150, one or more output devices 1160, and one or more communication connections 1170. An interconnection mechanism (not shown) such as a bus, a controller, or a network, interconnects the components of the computing environment 1100. Typically, operating system software (not shown) provides an operating environment for other software executing in the computing environment 1100, and coordinates activities of the components of the computing environment 1100.

The storage 1140 may be removable or non-removable, and includes magnetic disks, magnetic tapes or cassettes, CD-ROMs, CD-RWs, DVDs, or any other medium which can be used to store information and that can be accessed within the computing environment 1100. The storage 1140 stores instructions for the software 1180, which can be used to implement technologies described herein.

The input device(s) 1150 may be a touch input device, such as a keyboard, keypad, mouse, touch screen display, pen, or trackball, a voice input device, a scanning device, or another device, that provides input to the computing environment 1100. For audio, the input device(s) 1150 may be a sound card or similar device that accepts audio input in analog or digital form, or a CD-ROM reader that provides audio samples to the computing environment 1100. The output device(s) 1160 may be a display, printer, speaker, CD-writer, or another device that provides output from the computing environment 1100.

The communication connection(s) 1170 enable communication over a communication medium (e.g., a connecting network) to another computing entity. The communication medium conveys information such as computer-executable instructions, compressed graphics information, video, or other data in a modulated data signal. The communication connection(s) 1170 are not limited to wired connections (e.g., megabit or gigabit Ethernet, Infiniband, Fibre Channel over electrical or fiber optic connections) but also include wireless technologies (e.g., RF connections via Bluetooth, WiFi (IEEE 802.11a/b/n), WiMax, cellular, satellite, laser, infrared) and other suitable communication connections for providing a network connection for the disclosed computer-executable instructions. In a virtual host environment, the communication(s) connections can be a virtualized network connection provided by the virtual host.

Some embodiments of the disclosed methods can be performed using computer-executable instructions implementing all or a portion of the disclosed technology in a computing cloud 1190. For example, layout design operations can be performed in the computing environment while analysis operations can be performed on servers located in the computing cloud 1190. In some examples, the servers in the computing cloud 1190 are located in a different country or jurisdiction than the computing environment.

Computer-readable media are any available media that can be accessed within a computing environment 1100. By way of example, and not limitation, with the computing environment 1100, computer-readable media include memory 1120 and/or storage 1140. As should be readily understood, the term computer-readable storage media includes the media for data storage such as memory 1120 and storage 1140, and not transmission media such as modulated data signals.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope of these claims.

I claim:

1. A method comprising:
   decomposing geometric data representing layout features for an integrated circuit into homogeneous portions and nonhomogeneous portions, wherein decomposing the geometric data into the homogeneous portions and the nonhomogeneous portions comprises classifying a non-rectangular geometry as a particular nonhomogeneous portion;
   producing a shape descriptor comprising nodes within the nonhomogeneous portions;
   assigning parasitic values to segments connecting nodes of the shape descriptor; and
   generating a circuit representation of the conducting layer based on the shape descriptor and the assigned parasitic values.

2. The method of claim 1, wherein a respective node of the shape descriptor is a center of circle generated by a beachline algorithm.

3. The method of claim 1, wherein the parasitic value assigned to a particular segment is a function of a radius of a first circle associated with a first node of the particular segment and a radius of a second circle associated with a second node of the particular segment.

4. The method of claim 1, wherein decomposing the geometric data into homogeneous portions and nonhomogeneous portions comprises classifying a rectangular geometry with only two connections as a particular homogeneous portion.

5. The method of claim 1, wherein decomposing the geometric data into homogeneous portions and nonhomogeneous portions comprises adding a stub to the particular nonhomogeneous portion at a connection point between the particular nonhomogeneous portion and a particular homogeneous portion.

6. The method of claim 5, wherein the stub is a unit square having a width of the particular homogeneous portion.

7. The method of claim 1, wherein decomposing the geometric data into homogeneous portions and nonhomogeneous portions comprises classifying an area containing a contact or a via as another particular nonhomogeneous portion.

8. The method of claim 1, further comprising adding a particular node of the shape descriptor to correspond to a contact or a via within a particular nonhomogeneous portion.

9. The method of claim 8, wherein the particular node corresponding to the contact is added to the shape descriptor at the closest distance of the shape descriptor from the location of the contact.

10. The method of claim 1, further comprising identifying an area of a nonhomogeneous portion to model with finite element analysis based on a size of a circle used by the beachline algorithm within the area of the nonhomogeneous portion.

11. The method of claim 1, wherein the parasitic values comprise resistance values, capacitance values, or inductance values.

12. An apparatus, comprising:
a processor;
memory coupled to the processor; and
one or more computer-readable storage media storing computer-readable instructions that when executed by the processor, cause the processor to:
use geometric data for a conducting layer to identify homogeneous portions and nonhomogeneous portions of the conducting layer;
use a beachline algorithm to generate a skeleton comprising nodes within the nonhomogeneous portions;
determine resistance values between the nodes of the skeleton, wherein a resistance between a first node and second node of the skeleton is determined as a function of a distance between the first node and the second node and an average of a radius of a first circle centered at the first node of the particular segment and a radius of a second circle centered at the second node; and
configure the memory according to a netlist representative of the conducting layer based on the skeleton and the resistance values.

13. The apparatus of claim 12, wherein the beachline algorithm generates the skeleton using sites of the conducting layer as an input to the beachline algorithm, the sites including corners of the conducting layer.

14. The apparatus of claim 13, wherein the beachline algorithm comprises adding a circle tangent to a respective site an edge of the conducting layer, and a particular node of the skeleton is a center of the circle.

15. The apparatus of claim 12, wherein the resistance between the first node and the second node of the skeleton is determined further as a function of a radius of a first circle centered at the first node and a radius of a second circle centered at the second node.

16. The apparatus of claim 15, wherein the first circle is tangent to two points along edges of the conducting layer and the second circle is tangent to two different points along edges of the conducting layer.

17. A computer-readable memory comprising instructions that, when executed by a processor, cause the processor to:
decompose geometric data representing layout features for an integrated circuit into homogeneous portions and nonhomogeneous portions, wherein decomposition of the geometric data into the homogeneous portions and the nonhomogeneous portions includes classifying a nonrectangular geometry as a particular nonhomogeneous portion;
produce a shape descriptor comprising nodes within the nonhomogeneous portions;
assign parasitic values to segments connecting nodes of the shape descriptor; and
generate a circuit representation of the conducting layer based on the shape descriptor and the assigned parasitic values.

18. The computer-readable memory of claim 17, wherein the parasitic value assigned to a particular segment is a function of a radius of a first circle associated with a first node of the particular segment and a radius of a second circle associated with a second node of the particular segment.

19. The computer-readable memory of claim 17, wherein the instructions, when executed by the processor, further cause the processor to add a particular node of the shape descriptor to correspond to a contact or a via within a particular nonhomogeneous portion.

20. The computer-readable memory of claim 17, wherein the instructions, when executed by the processor, further cause the processor to decompose the geometric data into the homogeneous portions and the nonhomogeneous portions by adding a stub to the particular nonhomogeneous portion at a connection point between the particular nonhomogeneous portion and a particular homogeneous portion.

* * * * *